(12) United States Patent
Then et al.

(10) Patent No.: US 8,896,101 B2
(45) Date of Patent: Nov. 25, 2014

(54) NONPLANAR III-N TRANSISTORS WITH COMPOSITIONALLY GRADED SEMICONDUCTOR CHANNELS

(71) Applicants: Han Wui Then, Portland, OR (US); Sansaptak Dasgupta, Hillsboro, OR (US); Marko Radosavljevic, Portland, OR (US); Benjamin Chu-Kung, Hillsboro, OR (US); Seung Hoon Sung, Beaverton, OR (US); Sanaz K. Gardner, Hillsboro, OR (US); Robert S. Chau, Beaverton, OR (US)

(72) Inventors: Han Wui Then, Portland, OR (US); Sansaptak Dasgupta, Hillsboro, OR (US); Marko Radosavljevic, Portland, OR (US); Benjamin Chu-Kung, Hillsboro, OR (US); Seung Hoon Sung, Beaverton, OR (US); Sanaz K. Gardner, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/725,546

(22) Filed: Dec. 21, 2012

(65) Prior Publication Data

US 2014/0175515 A1 Jun. 26, 2014

(51) Int. Cl.
*H01L 29/20* (2006.01)
*H01L 29/772* (2006.01)
*H01L 29/66* (2006.01)

(52) U.S. Cl.
CPC ........ *H01L 29/772* (2013.01); *H01L 29/66409* (2013.01)
USPC ........................................................ 257/615

(58) Field of Classification Search
CPC .................. H01L 21/02387; H01L 21/02389; H01L 21/02538; H01L 21/0254; H01L 29/2003; H01L 29/785; H01L 29/7855

USPC ............................ 257/76, 191, 327, 328, 615
See application file for complete search history.

(56) References Cited

U.S. PATENT DOCUMENTS

| | | | |
|---|---|---|---|
| 2006/0180831 A1* | 8/2006 | Nakazawa et al. ............ | 257/189 |
| 2006/0231860 A1* | 10/2006 | Mishra et al. ................. | 257/192 |
| 2008/0237640 A1* | 10/2008 | Mishra et al. ................. | 257/194 |
| 2008/0308843 A1* | 12/2008 | Twynam ........................ | 257/191 |
| 2009/0008678 A1* | 1/2009 | Ando et al. .................... | 257/194 |
| 2009/0045438 A1* | 2/2009 | Inoue et al. ................... | 257/192 |
| 2009/0302350 A1 | 12/2009 | Datta et al. | |

(Continued)

FOREIGN PATENT DOCUMENTS

| | | |
|---|---|---|
| KR | 10-2012-0125789 A | 11/2012 |
| KR | 10-2012-0128088 A | 11/2012 |

OTHER PUBLICATIONS

International Search Report and Written Opinion mailed Sep. 25, 2013 for PCT/US2013/047432 filed Jun. 24, 2013.

(Continued)

*Primary Examiner* — Michele Fan
(74) *Attorney, Agent, or Firm* — Blakely, Sokoloff, Taylor & Zafman LLP

(57) ABSTRACT

A III-N semiconductor channel is compositionally graded between a transition layer and a III-N polarization layer. In embodiments, a gate stack is deposited over sidewalls of a fin including the graded III-N semiconductor channel allowing for formation of a transport channel in the III-N semiconductor channel adjacent to at least both sidewall surfaces in response to a gate bias voltage. In embodiments, a gate stack is deposited completely around a nanowire including a III-N semiconductor channel compositionally graded to enable formation of a transport channel in the III-N semiconductor channel adjacent to both the polarization layer and the transition layer in response to a gate bias voltage.

19 Claims, 10 Drawing Sheets

(56) References Cited

U.S. PATENT DOCUMENTS

| | | | |
|---|---|---|---|
| 2010/0140660 A1* | 6/2010 | Wu et al. | 257/183 |
| 2010/0289067 A1 | 11/2010 | Mishra et al. | |
| 2011/0121314 A1* | 5/2011 | Suh et al. | 257/76 |
| 2011/0235665 A1* | 9/2011 | Simon et al. | 372/44.011 |
| 2013/0043488 A1* | 2/2013 | Miyoshi et al. | 257/76 |
| 2013/0207075 A1* | 8/2013 | Myers et al. | 257/13 |

OTHER PUBLICATIONS

Pil Sung Park et al., Electron Gas Dimensionality Engineering in AlGaN/GaN High Electron Mobility Transistors Using Polarization, Applied Physics Letters 100, 063507 (2012), 2012 American Institute of Physics, pp. 063507-1-063507-3.

* cited by examiner

US 8,896,101 B2

NONPLANAR III-N TRANSISTORS WITH COMPOSITIONALLY GRADED SEMICONDUCTOR CHANNELS

TECHNICAL FIELD

Embodiments of the present invention generally relate to microelectronic devices and manufacture, and more particularly to group III-N transistor architectures.

BACKGROUND

The mobile computing (e.g., smart phone and tablet) markets benefit from smaller component form factors and lower power consumption. Because contemporary platform solutions for smart phones and tablets rely on multiple packaged integrated circuits (ICs) mounted onto a circuit board, further scaling to smaller and more power efficient form factors is limited. For example, a smart phone will include a separate power management IC (PMIC), radio frequency IC (RFIC), and WiFi/Bluetooth/GPS IC, in addition to a separate logic processor IC. System on Chip (SoC) architectures offer the advantage of scaling, which cannot be matched by board-level component integration. While the logic processor IC may itself be considered a system on a chip (SoC) integrating both memory and logic functions, more extensive SoC solutions for mobile computing platforms have remained elusive because the PMIC and RFIC operate with two or more of high voltage, high power, and high frequency.

As such, conventional mobile computing platforms typically utilize incompatible transistor technologies that are specifically tailored for the different functions performed by the PMIC and RFIC. For example, laterally diffused silicon MOS (LDMOS) technology is typically employed in the PMIC to manage voltage conversion and power distribution (battery voltage regulation including step-up and/or step-down voltage conversion, etc.). Group III-V compound semiconductors, such a GaAs heterojunction bipolar transistors (HBTs), are typically utilized in the RFIC to generate sufficient power amplification at GHz carrier frequencies. Conventional silicon field effect transistors implementing CMOS technology then entail a third transistor technology utilized for logic and control functions within the mobile computing platform. In addition to fundamental semiconductor material incompatibilities between the various ICs in the mobile computing platform, transistor design for DC-to-DC conversion switches in the PMIC has been generally incompatible with the transistor design for high frequency power amplifiers in the RFIC. For example, the relatively low breakdown voltage of silicon requires source-to-drain separation in a DC-to-DC converter switch to be vastly larger than is permissible for a power amplifier transistor needing an $F_t$ exceeding 20 GHz, and possibly up to 500 GHz, depending on the carrier frequency (e.g., WPAN is 60 GHz and so transistors need an $F_t$ many times 60 GHz). Such different transistor-level design requirements render the fabrication processes for the various transistor designs distinct and difficult to integrate into a single process.

Therefore, while an SoC solution for the mobile computing space that would integrate PMIC and RFIC functions is attractive for improving scalability, lowering costs, and improving platform power efficiency, one barrier to an SoC solution is the lack of a scalable transistor technology having both sufficient speed (i.e., sufficiently high gain cutoff frequency, $F_t$), and sufficiently high breakdown voltage (BV).

Group III-nitride (III-N) devices offer a promising avenue for integration of PMIC and RFIC functions with CMOS as both high BV and $F_t$ can be obtained. To date however, III-N transistors employ a 2D electron gas (2DEG), or sheet charge, as the transport channel. This 2D sheet charge is formed at the abrupt hetero-interface formed by epitaxial deposition of a film with larger spontaneous and piezoelectric polarization, such as MN, on GaN, for example. Because the polarization fields are highly directional, the 2D sheet charge only forms in the top (0001) wurtzite crystal plane at the hetero-interface. This material-based asymmetry poses a problem for implementing a multi-gate transistor architecture, such as the dual-gate and tri-gate designs now practiced in silicon by industry leaders. As such, the footprint of a III-N transistor may be disadvantageously large, and suffer various performance limitations akin to those that spurred the transition to non-planar silicon devices (e.g., short channel effects).

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

Figure 1A:
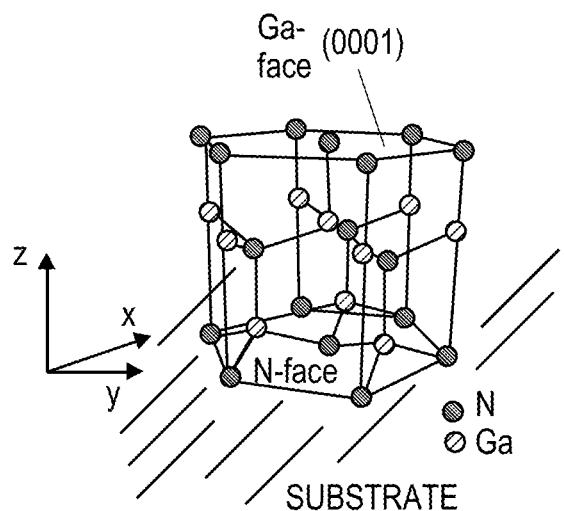
FIG. 1A is a isometric illustration of a GaN crystal orientation for a non-planar group III-N transistor, in accordance with an embodiment.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are embodiments of non-planar III-N transistors having a III-N semiconductor channel that is compositionally graded in a manner that forms a 3-dimensional electron gas (3DEG) within the III-N semiconductor channel. In practice, the non-planar III-N transistor architectures described herein offer advantageously low extrinsic resistance and/or reduce substrate surface area for given drive current. In embodiments, the graded III-N semiconductor channel has multiple gated surfaces, enabling reduced short channel effects and enabling higher drain breakdown voltages ($BV_{DD}$).

In embodiments, the high electron mobility field effect transistors (FETs) described herein are employed in SoC solutions integrating an RFIC with a PMIC to implement high voltage and/or high power circuits. With the transistor structures described herein, SoC solutions may deliver the product-specific electrical current and power requirements needed for a mobile computing platform. The fast switching, high voltage transistors are capable of handling high input voltage swings and providing high power added efficiencies at RF frequencies. In embodiments, the III-N transistor architectures described herein are monolithically integrated with group IV transistor architectures, such as planar and non-planar silicon CMOS transistor technologies. In particular embodiments, the III-N transistors described herein are employed in SoC architectures integrating high power wireless data transmission and/or high voltage power management functions with low power CMOS logic data processing. High frequency operation suitable for broadband wireless data transmission applications is possible while the use of large band gap III-N materials also provides a high BV generation of sufficient RF for wireless data transmission applications. This combination of high $F_t/F_{max}$ and high voltage capability also enables the III-N FET architectures described herein to be used for high speed switching applications in DC-to-DC converters utilizing inductive elements of reduced size. As both the power amplification and DC-to-DC switching applications are key functional blocks in smart phones, tablets, and other mobile platforms, the structures described herein may be utilized in a SoC solution for such devices. As one example a first III-N FET is employed in a DC-to-DC switching circuit of a PMIC and a second III-N FET is employed in an amplifier circuit of an RFIC.

Figure 1B:
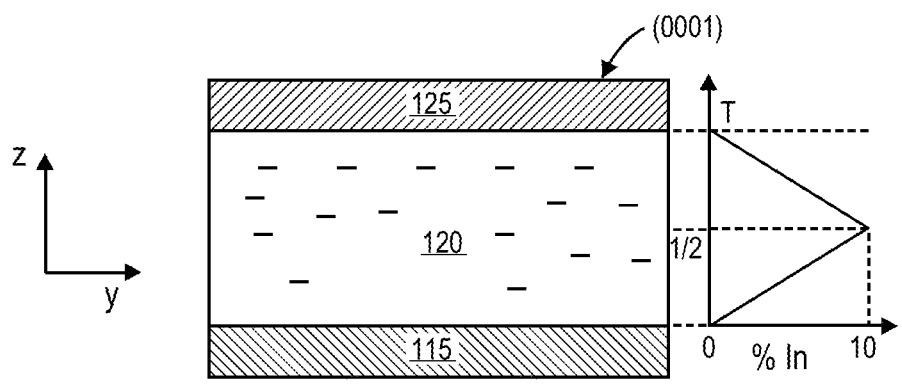
FIGS. 1B, 1C, and 1D are graphs of an alloy content corresponding to regions of a compositionally graded III-N semiconductor channel shown in cross-section and having the crystal orientation illustrated in FIG. 1A, in accordance with an embodiment.

In embodiments, a III-N semiconductor channel of a III-N FET comprises a III-N ternary or quaternary compositionally graded alloy. In one ternary embodiment, the III-N semiconductor channel comprises indium gallium nitride ($In_xGa_{1-x}N$), where x is varied along the wurzite crystal c-axis of the semiconductor channel. In another ternary embodiment, the III-N semiconductor channel comprises aluminum gallium nitride ($Al_xGa_{1-x}N$), where x is varied along the c-axis of the semiconductor channel. In a quaternary embodiment, both indium and aluminum are present as an $In_xAl_yGa_{1-x-y}N$ alloy with x and/or y varied along the c-axis of the semiconductor channel. FIG. 1A is an isometric illustration of a GaN crystal orientation for a non-planar group III-N transistor, in accordance with an embodiment. FIG. 1B is a cross-sectional view of an InGaN-based compositionally graded III-N semiconductor channel having the crystal orientation illustrated in FIG. 1A. A graph of alloy content corresponding to regions within the III-N semiconductor channel is further depicted The GaN crystal illustrated in FIG. 1A is non-centrosymmetric, meaning that the III-N crystal lacks inversion symmetry, and more particularly the {0001} planes are not equivalent. For pure GaN, the (0001) plane is typically referred to as the Ga-face (+c polarity, or in the [0001] direction) and the other, the (000$\bar{1}$) plane is referred to as the N-face (−c polarity, or in the [000$\bar{1}$] direction). The orientation in FIG. 1A is therefore Ga-face, or (0001), with the (0001) plane having the lattice constant a on a top surface of the III-N semiconductor channel As a result of polar bonding and the crystal asymmetry, a spontaneous polarization field, $P_{SP}$, is present within the III-N semiconductor and when the III-N semiconductor is under tensile strain in a direction parallel to the (0001) plane (along y-dimension as shown in FIG. 1B), a piezoelectric polarization field $P_{PE}$ is aligned with $P_{SP}$ away from the (0001) plane and toward the (000$\bar{1}$) plane). Compositional grading within the III-N semiconductor can spread these polarization fields to provide a desired distribution polarization-induced charge carriers (e.g., n-type) relative the particular crystal face, Ga or N. Notably, spontaneous polarization fields in InN and MN when deposited on Ga-face of GaN are oriented opposite to each other and therefore embodiments herein achieve a desired distribution of polarization carrier charge within the III-N semiconductor channel volume by grading In content in a first direction (e.g., increasing In %) relative to either the Ga or N face, while embodiments grading Al content do so in the opposite direction (e.g., decreasing Al %).

In embodiments, In content is graded to have relatively more pure GaN (e.g., 0% In) at an interface of a wide band gap material. With such a grading, a 3D electron gas can be formed within the graded semiconductor, with no charge carriers present proximate to a substrate region, which can be advantageous for reducing or preventing leakage path, as further described elsewhere herein in the context of FIGS. 2A-2B. As shown in FIG. 1B, grading of the In content is further advantageously symmetric about a plane centered between the interface of a wide band gap transition layer 115 and the interface of a wide band gap III-N polarization layer 125. In embodiments, In content is graded upwards from the respective III-N faces to meet at approximately half the c-axis thickness of the graded III-N semiconductor channel 120. Such a grading profile may be advantageous with respect to achieving a particular transport channel geometry with a minimal range of alloy content between the Ga and N face. Variations where the In grading is asymmetric about the center plane are also possible.

For the symmetrically graded embodiment shown in FIG. 1B, beginning at the interface with the transition layer 115, the III-N semiconductor channel 120 is graded with increasing Indium content over a first distance equal to approximately one half of the thickness of the III-N semiconductor channel 120 (½ T). Then, the III-N semiconductor channel 120 is further graded with decreasing Indium content over a second distance equal to approximately ½ T to the interface of the polarization layer 125. In the exemplary embodiment, In content is 0% (i.e., $In_xGa_{1-x}N$ with x=0, or pure GaN) at the interface of the semiconductor channel 120 with each of the wide band gap transition and polarization layers, 115, 125. As illustrated in FIG. 1B by the general location of the charge symbols, with pure GaN at the (000$\bar{1}$) face of the III-N semiconductor channel 120, charge carriers are absent from the interface with the wide band gap transition layer 115.

In the exemplary embodiment, maximum In content reaches approximately 10%, although may be higher (e.g., 15-20%) in other embodiments. Over this range, grading is advantageously a uniform over the grading distance to achieve a uniform polarization charge density. In the exemplary embodiment, grading is linear in directions away from the (0001) surface and away from the (000$\bar{1}$) surface of the III-N semiconductor channel 120 toward the half-thickness, or center plane. Of course non-linear gradings (e.g., parabolic over the thickness of the semiconductor channel 120, etc.) are also possible.

Figure 1C:
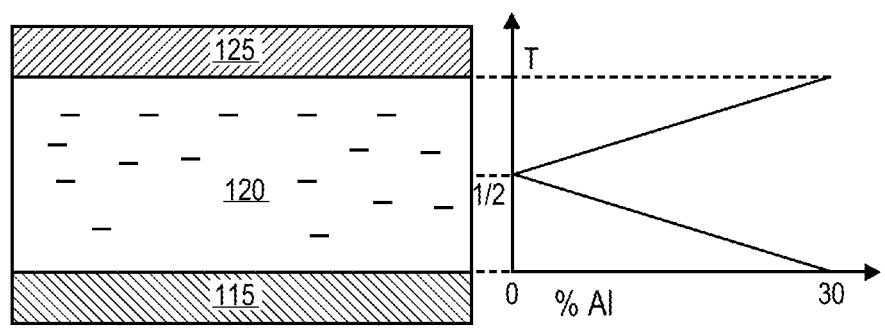

FIG. 1C is a cross-sectional view of an $Al_xGa_{1-x}N$ based compositionally graded III-N semiconductor channel 120 with the crystal orientation illustrated in FIG. 1A, in accordance with an embodiment. Beginning at the interface with the transition layer 115, the III-N semiconductor channel 120 is graded with decreasing Al content over a first distance equal to approximately one half of the thickness of the III-N semiconductor channel 120 (½ T). The III-N semiconductor channel 120 is further graded with increasing Al content over a second distance equal to approximately ½ T to the interface of the polarization layer 125. In the exemplary embodiment, Al content is 0% (i.e., pure GaN) at the half thickness, or center plane of the semiconductor channel 120 with a maximum Al content (e.g., 30%, or more) at the interface of each of the wide band gap transition and polarization layers, 115, 125. As illustrated in FIG. 1C, charge carriers are again absent from the interface with the wide band gap transition layer 115.

Within the semiconductor channel 120, Al grading is advantageously uniform to achieve a uniform polarization charge density. In the exemplary embodiment, grading is linear from the (0001) and (000$\bar{1}$) surfaces of the III-N semiconductor channel 120 toward the half-thickness, or center plane. Of course non-linear gradings (e.g., parabolic over the thickness of the semiconductor channel 120, etc.) are again possible.

For quaternary embodiments, a grading of Al and/or In is consistent with those illustrated in FIGS. 1B, 1C with at least one of the Al and In content varied (e.g., reduce or increased) from the transition layer 115 over a first distance equal to approximately one half of the thickness of the III-N semiconductor channel 120 (½ T) and then symmetrically varied (e.g., increased or reduced) over a second distance equal to approximately one half of the thickness of the III-N semiconductor channel 120 (½ T) to the polarization layer 125.

Figure 1D:
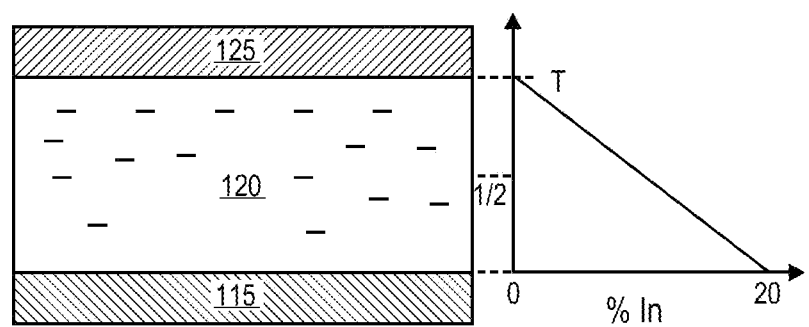

In other embodiments, In content is graded to have highest In content at the interface of a wide band gap material at the N-face (000$\bar{1}$) and lowest In content at the interface of a wide band gap material at the Ga-face (0001). This alternate grading profile is depicted in FIG. 1D along with a corresponding cross-sectional view of the III-N semiconductor channel 120, and high band gap layers 115, 125. As shown, the In content at the interface with the high band gap transition layer 115 is sufficiently high for charge carriers (electrons) to be present within the III-N semiconductor channel 120 adjacent to the wide band gap transition layer 115 when a bias voltage above the threshold voltage is applied to a gate electrode. In the exemplary embodiment, the peak In content is 20%, although it may range from 15-20%. Again, uniform grading is advantageous with the exemplary embodiment being a linear grading such that the In content at the half-thickness is again about 10%, with substantially pure GaN at the interface of the polarization layer 125. Notably, grading Al content, even with a profile opposite that described for In will not have the same effect since the GaN band gap is much wider than that for the InGaN embodiments.

Noting the embodiments shown in FIGS. 1B and 1C entail grading profiles that are inverted with respect to each other as a result of the different polarization strengths of the Al and In ternary alloys, the grading profile may be more conveniently expressed as a function of band gap. With the band gap of InGaN smaller than that of GaN and the band gap of AlGaN wider than that of GaN, each of the grading profiles in FIGS. 1B, 1C, and even 1D, reduce the band gap over a distance from at least one of the two wide band gap material layers, 115 and 125 (toward a center plane of the semiconductor channel in FIGS. 1B and 1C and toward the second wide band gap material layer in FIG. 1D). In other words, for the embodiments depicted in FIGS. 1B and 1C, the band gap decreases from both of the two wide band gap material layers 115 and 125 toward the center plane. For the embodiment depicted in FIG. 1D, the band gap decreases from the wide band gap material layer 125 toward the wide band gap material layer 115.

Figure 1E:
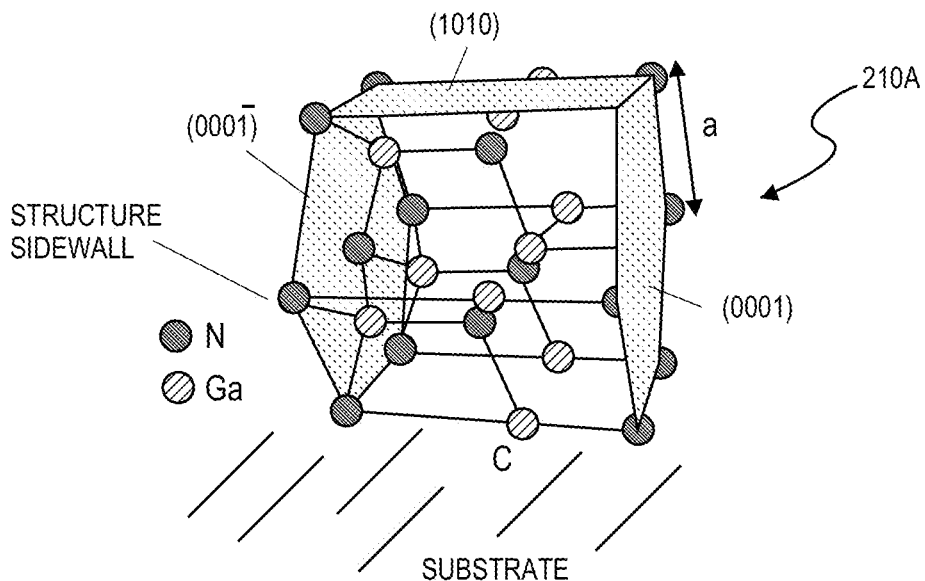
FIG. 1E is a isometric illustration of a GaN crystal orientation for a non-planar group III-N transistor, in accordance with an embodiment.
Figure 1F:
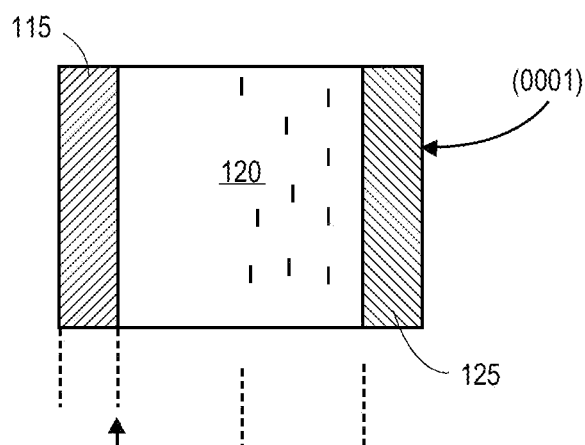
FIG. 1F is a graph of an alloy content corresponding to regions of a compositionally graded III-N semiconductor channel shown in cross-section and having the crystal orientation illustrated in FIG. 1E, in accordance with an embodiment.
Figure 1F:
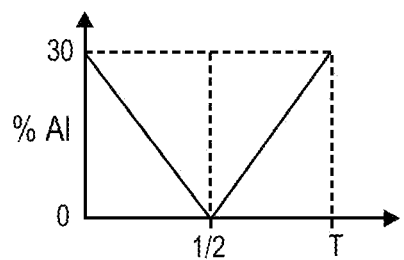

Notably, the grading profiles described in FIGS. 1A-1D are equally applicable to epitaxial channel layers grown on sidewall surfaces of a substrate, which may be done for example for the purpose of providing a (111) or (110) seeding surface of a (110) or (100) substrate. For such embodiments, as shown in FIG. 1E, a structured template surface extends from the substrate such that III-N wurzite crystal is rotated to have the {0001} faces form sidewalls and the one of the {10$\bar{1}$0} faces form top and bottom surfaces. FIG. 1F depicts exemplary In and/or Al grading profiles for the III-N semiconductor channel 120 having the orientation in FIG. 1E.

Figure 2A:
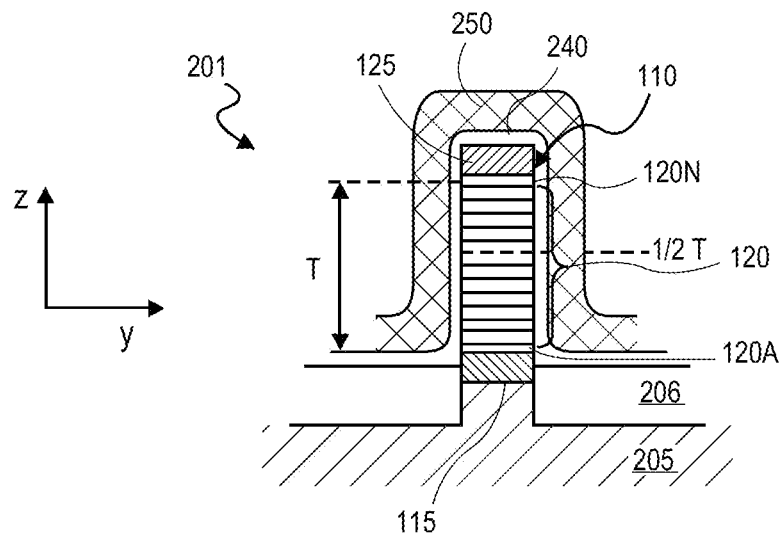
FIG. 2A depicts a cross-section through a channel region of a tri-gated non-planar III-N transistor, in accordance with embodiments of the invention.

FIG. 2A depicts a cross-section through a channel region of a tri-gated non-planar III-N transistor 201, in accordance with embodiments of the invention. Generally, the transistor 201 employs the graded III-N semiconductor channel 120 as described elsewhere herein in the context of FIGS. 1A-1B and reference numbers are therefore retained for features previously described. The III-N transistor 201 is a gate voltage controlled device (i.e., a FinFET), and in the exemplary embodiment is an n-type FinFET including at least one non-planar crystalline semiconductor channel 120 that is disposed on a substrate layer 205.

In an embodiment, the substrate layer 205 includes a buffer layer composed of a group III-N semiconductor grown (depicted in FIG. 1A) on a support substrate (not depicted). In a particular embodiment, the substrate layer 205 includes one or more layer of GaN disposed on a silicon support substrate. In the exemplary embodiment, the silicon support substrate is substantially monocrystalline and is (100) silicon (i.e., having a (100) top surface) or (110) silicon (i.e., having a (110) top surface). The support substrate may also be of alternate materials, which may or may not be combined with silicon, including, but not limited to, germanium, indium antimonide, lead telluride, indium arsenide, indium phosphide, gallium arsenide, or gallium antimonide, carbon (SiC), and sapphire.

As further shown in FIG. 2A, the transistor 201 includes a non-planar III-N semiconductor body separated from the substrate layer 205 by the transition layer 115. In the exemplary embodiment, the transition layer 115 is of a composition and physically positioned with respect to the III-N semiconductor channel 120 so as to prevent, or at least reduce, leakage from the transistor 101 into the substrate layer 105 (i.e., sub-fin leakage). The transition layer 115 is therefore to be of a wider band gap material than the III-N semiconductor channel material in direct contact with the transition layer 115. The transition layer 115 is also to permit epitaxial growth of the III-N semiconductor channel 120 and so is to also have wurtzite crystallinity. As such the transition layer 115 may be one or more III-N material or crystalline dielectrics with exemplary III-N materials including AlN, AlGaN (e.g., $Al_{<0.3}Ga_{>0.7}N$), or AlInN (e.g., $Al_{0.83}In_{0.17}N$) and exemplary crystalline dielectrics including wurzite crystalline nitrides, such as TiN, SiN, AlN, and wurtzite crystalline oxides, such as $Al_2O_3$, $Gd_2O_3$, $Sc_2O_3$, $Ta_2O_5$, and $TiO_2$. Such dielectric material layers are typically deposited as polycrystalline layers and then when subjected to the high growth temperature of III-N semiconductors, tend to form crystals suitable as templates for III-N growth.

Disposed on the transition layer 115 is the III-N semiconductor channel 120. According to embodiments, the III-N semiconductor channel 120 has the wurtzite structure and is compositionally graded along the growth direction normal to the {0001} basal plane (i.e., along the c-axis of the III-N semiconductor crystal) as was described in the context of FIGS. 1A-1C. In embodiments, the III-N semiconductor channel 120 has a thickness (z-axis in FIG. 2A) of between 25 nm and 100 nm. In embodiments, the III-N semiconductor channel 120 has intrinsic impurity doping level with no intentional dopants. As shown in FIG. 2A the III-N semiconductor channel 120 comprises the plurality of layers 120A-120N to emphasize the compositional grading within a thickness of the III-N semiconductor channel along c-axis. In the exemplary embodiment, In is graded to peak concentration at approximately one half the semiconductor channel thickness, T. In the exemplary embodiment, the III-N semiconductor channel 120 comprises InGaN, which has an advantage over AlGaN embodiments as the polarization field of InGaN is orientated opposite to that of AlGaN and GaN, and also, in that the conduction band offset from the wide band gap transition layer 115 will be greater. This results in relatively better carrier confinement for a given transition layer material and/or relax constraints on the transition layer composition (e.g., permitting a lower Al content in an AlGaN transition layer)>

As further illustrated in FIG. 2A, disposed on the (0001) surface of the III-N semiconductor channel 120 is a polarization layer 125. The polarization layer 125 is functionally to serve as a charge-inducing layer to controllably supply carriers to the III-N semiconductor channel 120. In exemplary embodiments, the polarization layer 125 ranges between 1 nm and 20 nm in thickness. The polarization layer may further serve as a means of carrier confinement where the band gap is sufficiently wide. In exemplary embodiments, the polarization layer 125 includes at least one of AlInGaN, AlGaN, AlInN, or MN. The polarization layer 125 may also entail a plurality of compositionally distinct layers, such as a first charge inducing layer and an overlying top barrier layer of distinct composition to permit transistor threshold voltage tuning while ensuring a thin (e.g., >0.5 nm) wideband gap material is at the surface of the semiconductor channel layer for reduced alloy scattering and high carrier mobility.

With the compositional grading as described in the context of FIGS. 1A-1B, polarization fields (and band gaps) are varied within the graded III-N semiconductor channel 120 to permit formation of a volume of charge within the III-N semiconductor channel 120 that can then be modulated by the field effect through the gate dielectric 240 as a function of a voltage potential on a gate electrode 250. Through selection of a work function for a gate electrode 250, a threshold voltage ($V_t$) can be set to define on and off states of connectivity between source and drain ends of the semiconductor channel 120. As any conventional source/drain architectures may be utilized for the transistor 201, further detail of the source/drain regions omitted.

Figure 2B:
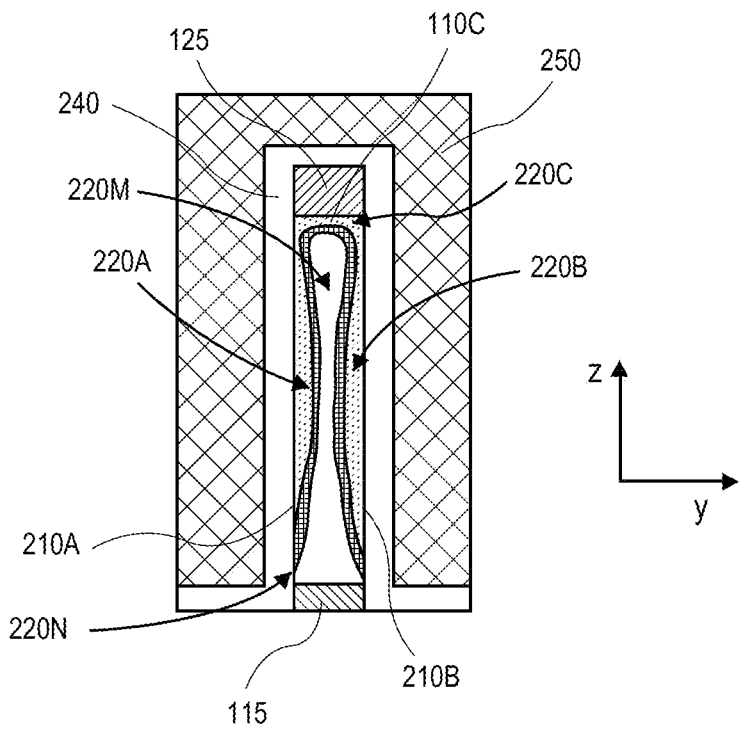
FIG. 2B depicts modeled charge within the channel region illustrated in FIG. 2A, in accordance with embodiments of the invention.

FIG. 2B depicts modeled charge within the III-N semiconductor channel of the transistor 201 illustrated in FIG. 2A, in accordance with embodiments of the invention. The thickness (z-dimension) of the III-N semiconductor channel 120 is modeled as 50 nm and a y-dimension width of 10 nm. As shown, relative to the region 220M, regions of higher charge density associated with transport channels are present along multiple surface planes within the III-N semiconductor channel 120 under gate bias conditions above the threshold voltage. Thus, in addition to a transport channel 220C having higher charge density proximate to the (0001) top III-N semiconductor channel surface 110C, there are also the additional transport channels 220A and 220B proximate to the III-N semiconductor channel sidewalls 210A and 210B (i.e., proximate to the {1010} planes). This greater transport channel dimensionality (i.e., 3D rather than only 2D) is a result of compositionally grading the III-N semiconductor channel 120 in the manner consistent with embodiments described in the context of FIGS. 1A-1B. Notably, with substantially pure GaN at interface of the transition layer 115, no transport channel is present proximate to the transition layer 115 even under gate bias conditions above the threshold voltage. As such, the sidewall transport channels 220A, 220B are pinched-off at the base 220N of the non-planar transistor 201, reducing sub-fin leakage. Thus, the III-N FinFET 201 has an advantageous multi-sided transport channel that is responsive to the gate stack present on the sidewalls of the III-N semiconductor channel 120.

Figure 2C:
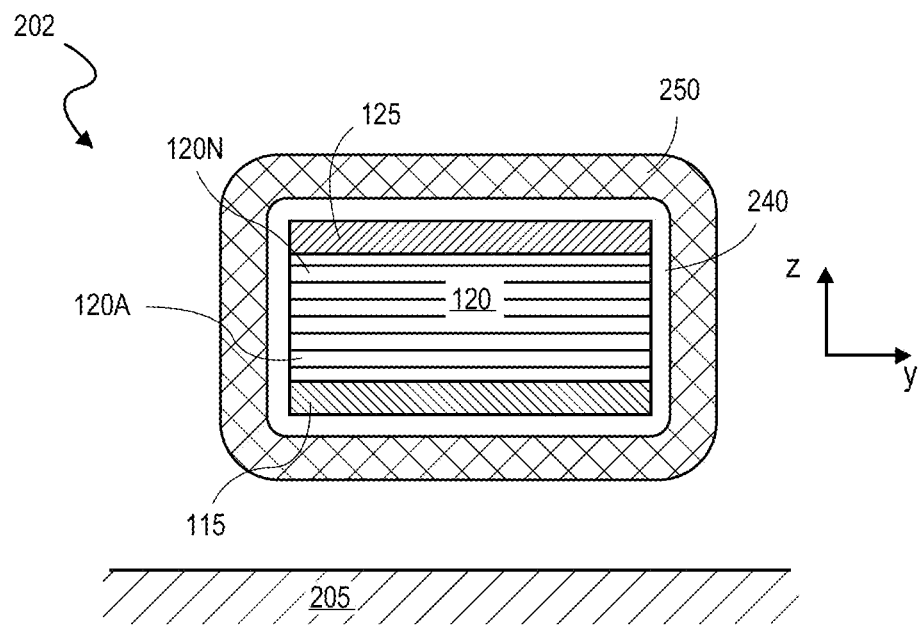
FIG. 2C depicts a cross-section through a channel region of a gate-all-around non-planar III-N transistor, in accordance with embodiments of the invention.

FIG. 2C depicts a cross-section through a channel region of a multi-gated non-planar III-N transistor 202, in accordance with embodiments of the invention. Generally, the transistor 202 employs the graded III-N semiconductor channel 120 as described elsewhere herein in the context of FIG. 1D and reference numbers are therefore retained for features previously described. The III-N transistor 202 is a gate voltage controlled device (i.e., a "gate-all-around" or "nanowire" FET), and in the exemplary embodiment is an n-type nanowire FET including at least one non-planar crystalline semiconductor channel 120 that is disposed over the substrate layer 205.

As shown in FIG. 2C, the transistor 202 includes a non-planar III-N semiconductor body separated from the substrate layer 205 by the transition layer 115, as well as the gate dielectric 240 and gate electrode 250. Disposed on the transition layer 115 is the III-N semiconductor channel 120. According to exemplary embodiments, the III-N semiconductor channel 120 is compositionally graded along the growth direction normal to the {0001} basal plane (i.e., along the c-axis of the III-N semiconductor crystal) as was described in the context of FIG. 1D. In embodiments, the III-N semiconductor channel 120 has a thickness (z-axis in FIG. 2C) less than that for the transistor 201, for example less than 30 nm. The y-dimension, or width of the III-N semiconductor channel 120 is greater than the z-axis thickness (e.g., 50 nm, or more) for a "ribbon" geometry. Other dimensions are of course possible. Channel doping is optional and in certain embodiments, the III-N semiconductor channel 120 again has intrinsic impurity doping level with no intentional dopants. As shown in FIG. 2C the III-N semiconductor channel 120 comprises the plurality of layers 120A-120N to emphasize the compositional grading. In the exemplary embodiment, In is graded from a peak concentration (e.g., ~20%) at the interface of the transition layer 115 to 0% (pure GaN) at the interface of the polarization layer 125.

Figure 2D:
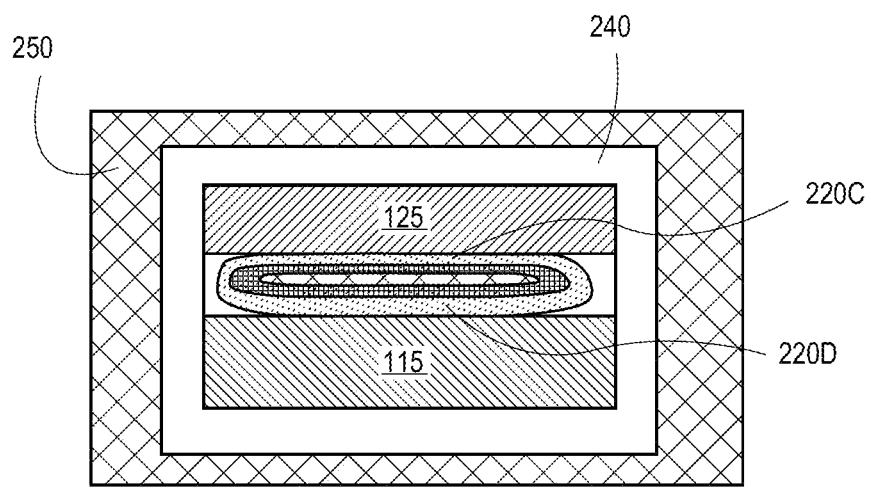
FIG. 2D depicts modeled charge within the channel region illustrated in FIG. 2C, in accordance with embodiments of the invention.

FIG. 2D depicts modeled charge within the III-N semiconductor channel of the transistor 202 illustrated in FIG. 2C under application of a positive potential on the gate electrode 250, in accordance with embodiments of the invention. Charge density associated with transport channels is again present along multiple surface planes within the III-N semiconductor channel 120 under gate bias conditions above the threshold voltage. In addition to a transport channel 220C proximate to the (0001) surface 110C, there is also the additional transport channel 220D proximate to the (000$\bar{1}$) surface of the III-N semiconductor channel 120. This greater transport channel dimensionality (i.e., 3D rather than only 2D) is a result of compositionally grading the III-N semiconductor channel 120 in a manner consistent with embodiments described in the context of FIG. 1D. Notably, with 20% In content at interface of the transition layer 115, the transport channel 220D proximate to the transition layer 115 overlaps the transport channel 220C under gate bias conditions above the threshold voltage for a highest carrier concentration toward a center of the nanowire. The top and bottom surfaces the nanowire semiconductor are therefore both functionally gate coupled.

Figure 3:
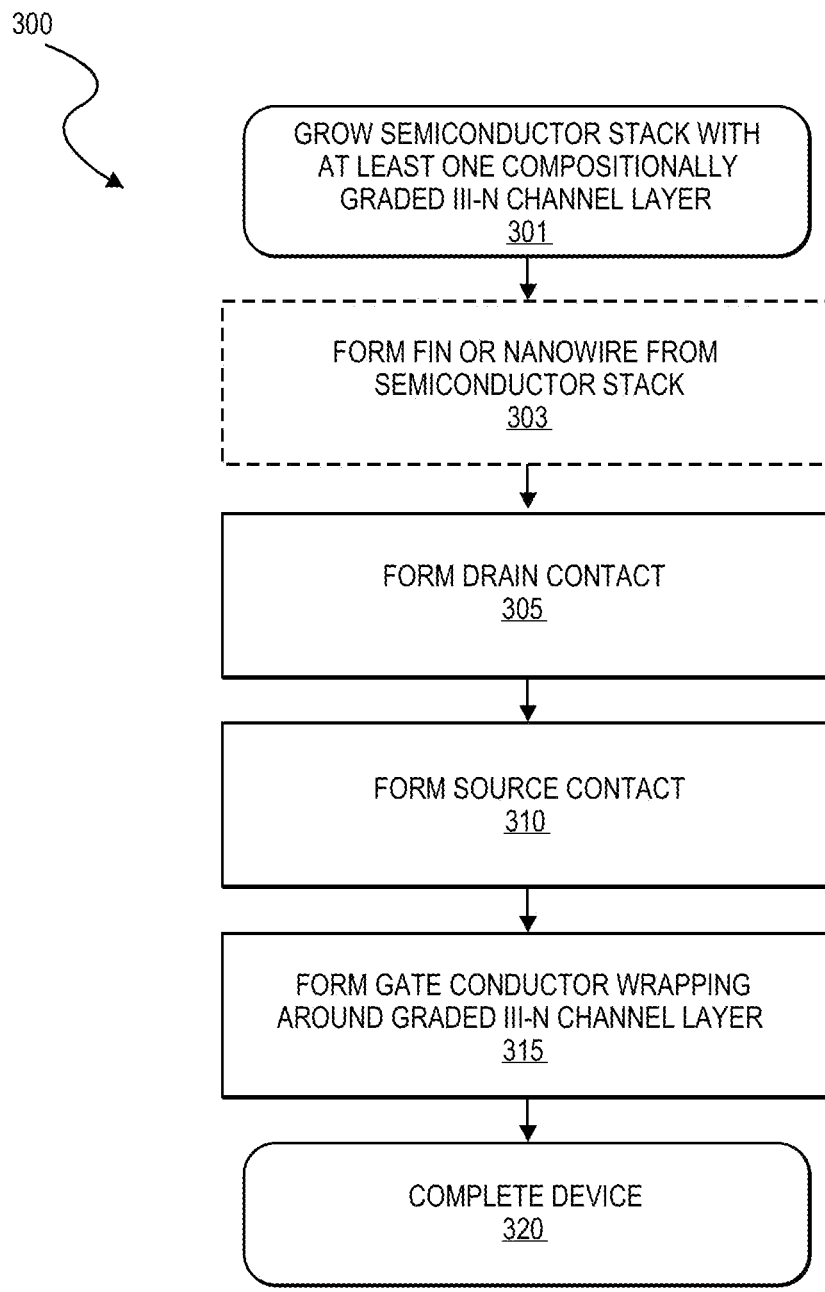
FIG. 3 is a flow diagram illustrating a method of fabricating a non-planar high voltage transistor, in accordance with an embodiment.

FIG. 3 is a flow diagram illustrating a method 300 of fabricating a non-planar III-N field effect transistor (FET), in accordance with embodiments of the invention. While method 300 highlights the main operations, each operation may entail many more process sequences, and the numbering of the operations or relative positioning of the operations in FIG. 3 implies no order. The method 300 begins with growing a III-N semiconductor stack at operation 301 by a technique, such as, but not limited to, MOCVD, MOVPE, or MBE. More particularly, the operation 301 entails forming a crystalline wide band gap transition layer, such as any of those described elsewhere herein for the transition layer 115. A III-N ternary or quaternary semiconductor channel layer is then grown over the transition layer, with partial pressures of the alloy constituents varied appropriately to grade the composition of the III-N semiconductor channel layer over a thickness of the channel layer as described elsewhere herein (e.g., toward a narrower band gap composition proximate the polarization layer).

The grading may further be performed uniformly and symmetrically about a half thickness of the III-N semiconductor channel layer. For example, during epitaxial growth from the transition layer, the composition of the III-N semiconductor channel layer may be varied from a first lower indium content proximate to the transition layer with monotonically increasing indium content toward the narrowest band gap composition, and with monotonically decreasing indium content to the second wider band gap composition. Alternatively, for a nanowire embodiment, at operation 301 the composition of the III-N semiconductor channel layer may be varied during growth from a highest indium content proximate to the transition layer with monotonically decreasing indium content toward the narrowest band gap composition before changing reactor conditions for growth of the polarization layer. For example, grading of In from 0% to 10%, or more, may occur during operation 301. As another example, a grading of Al from 30%, or more, down to 0% and back to 30%, or more may be performed at operation 301. Following grading of the III-N semiconductor channel, a wide band gap polarization layer is then epitaxially grown over the III-N semiconductor channel layer proximate to the wider band gap composition.

Figure 4A:
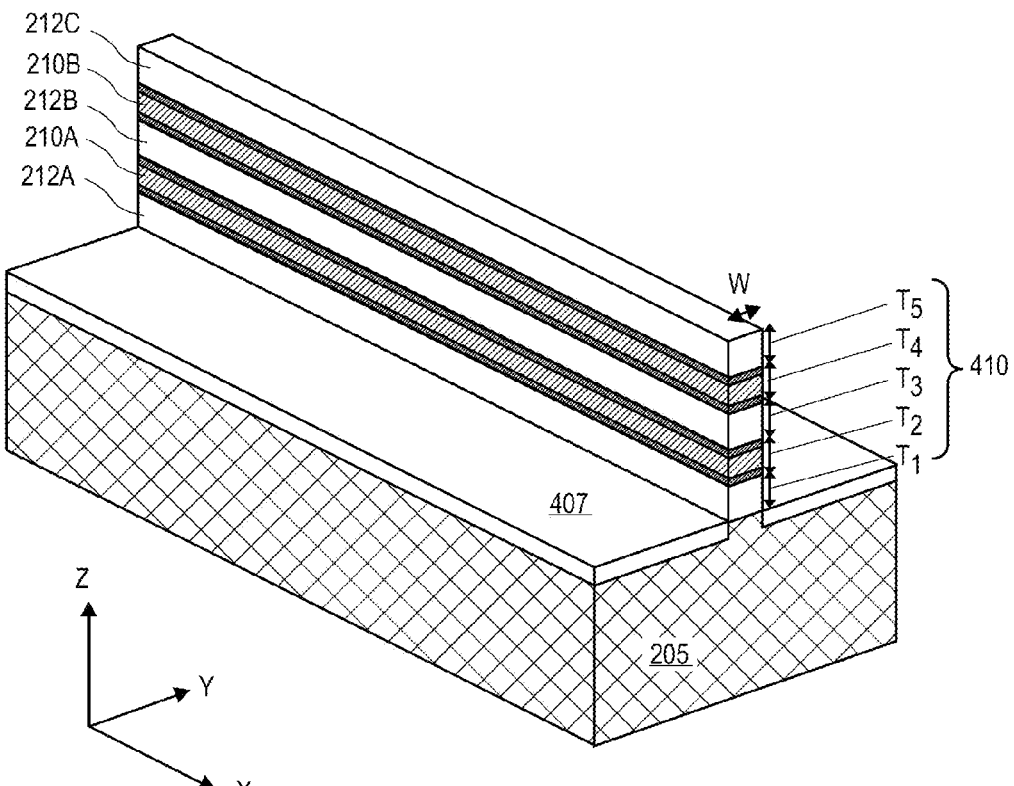
FIGS. 4A, 4B, 4C, and 4D are isometric illustrations of a non-planar high voltage nanowire transistor fabricated in accordance with an embodiment of the method illustrated in FIG. 3.

The operation 301 is applicable to either a finFET embodiment or a nanowire embodiment and selective epitaxial techniques may be used to grow a fin or nanowire structure, or alternatively a patterning process may be performed at operation 303 to form fin or nanowire structure from a blanket (non-selective) epitaxial growth. FIGS. 4A, 4B, 4C, 4D and 4E are isometric illustrations of non-planar group III-N nanowire transistors fabricated in accordance with an embodiment of the method 300. Notably, the fin structure 410 depicted in FIG. 4A is the more complicated species of a finFET with the homogenous finFET 201 having substantially the same general structure, but with a single III-N semiconductor layer having the grading of FIGS. 1B-1C. The FIGS. 4A-4E are therefore equally applicable to formation of the finFET 201 as the nanowire transistor 202.

FIG. 4A depicts a vertical stack of nanowires 210A and 210B, each having the graded semiconductor channel disposed between the wide band gap transition and polarization layers, as depicted in FIG. 1D. Disposed between the nanowire 210A, 210B are sacrificial materials 212A, 212B, and 212C of a distinct composition. The layer thicknesses, $T_1$-$T_4$ are dependent on the desired nanowire dimensions and also on the ability to backfill the thicknesses $T_1$, $T_3$ with the gate stack. An insulator layer 407 is formed on either side of the fin structure 410 over the substrate layer 205, for example by a shallow trench isolation technique.

Returning to FIG. 3, at operation 305, a drain contact is formed to wrap around the nanowire 210A and 210B either partially or completely. At operation 310, a source contact is similarly formed. At operation 315, a gate conductor is coaxially wrapped completely around the graded semiconductor channel within the III-N stacks 210A and 210B. The device is then completed at operation 320, for example using conventional interconnect techniques.

Figure 4B:
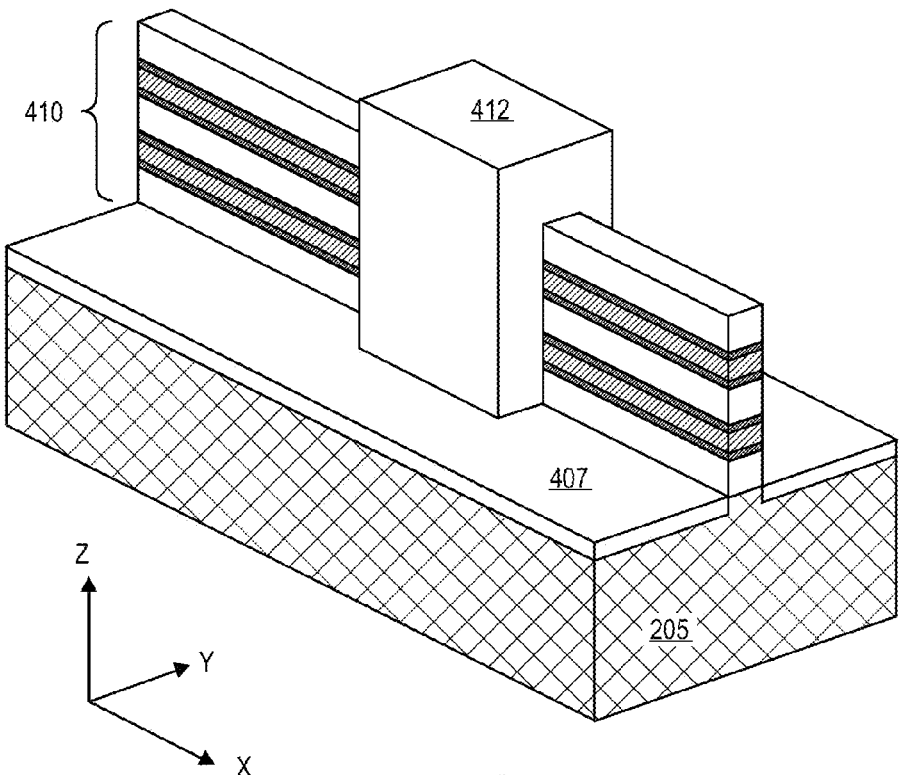
Figure 4C:
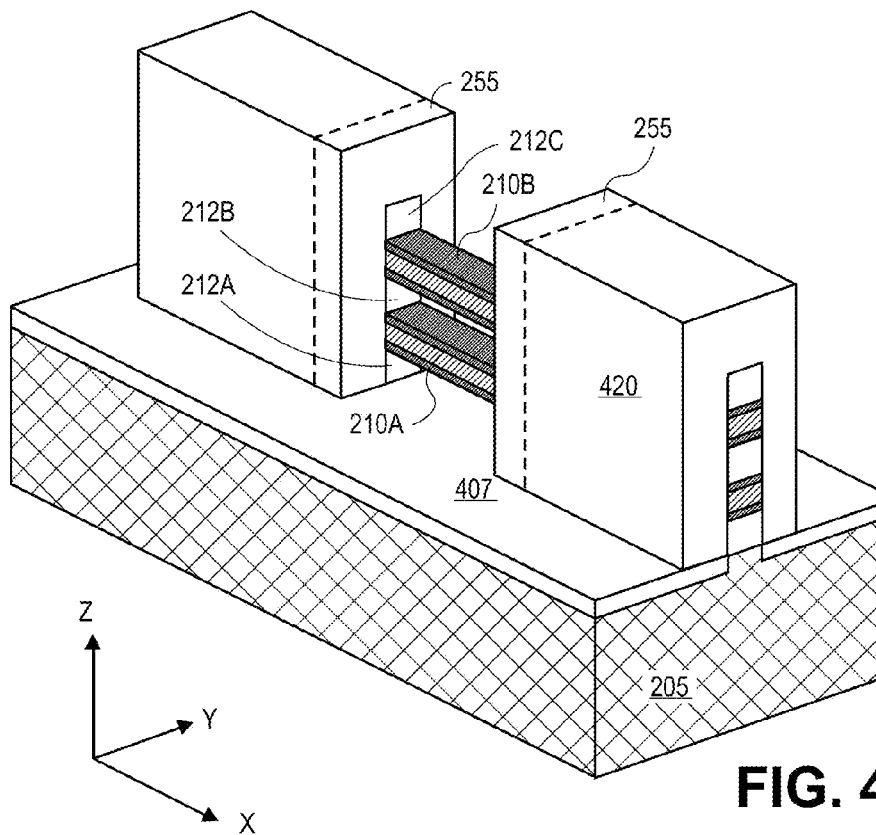

FIG. 4B illustrates one embodiment of the operations 305, 310 and 315 that entails forming a sacrificial gate 412 disposed on the fin structure 410. Referring to FIG. 4C, the sacrificial gate 412 has been removed, leaving spacers 255 and portion of the interlayer dielectric layer (ILD) 420. As further shown in FIG. 4C, the sacrificial semiconductor layers 212A, 212B, and 212C are removed in the channel region originally covered by the sacrificial gate 412. Discrete nanowires 210A and 210B of the first semiconductor material then remain.

Figure 4D:
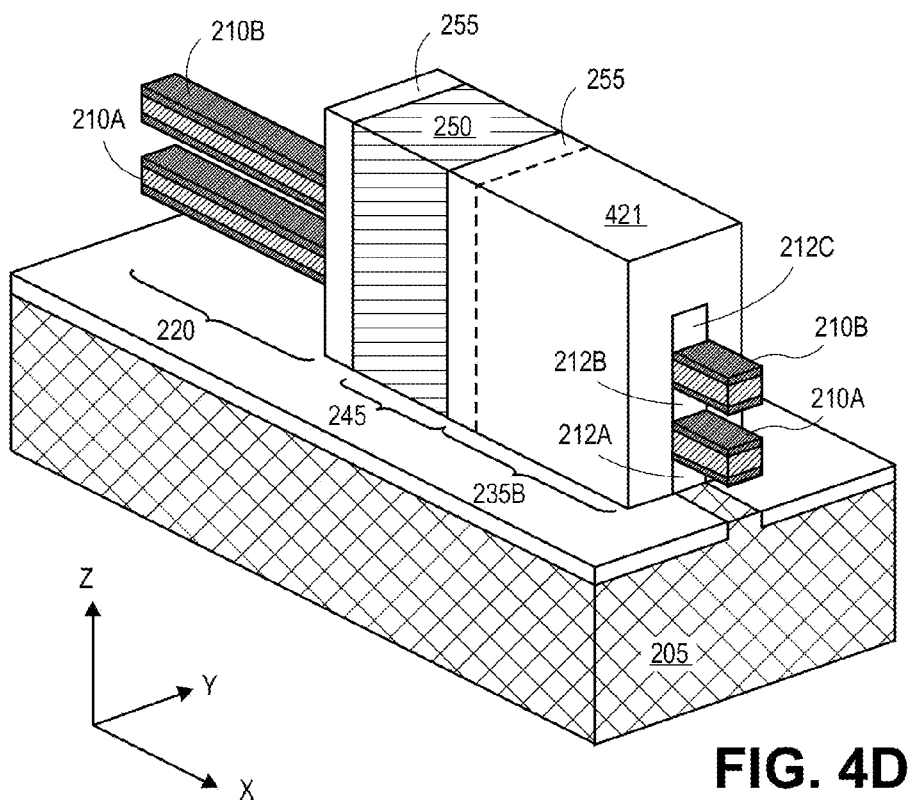

As shown in FIG. 4D, the gate stack is then formed coaxially wrapping around the nanowires 210A, 210B within the channel region 245. The gate 250 formed in the trench in the interlayer dielectric layer 420 after etching the epitaxial stack into discrete group III-N nanowires. Additionally, FIG. 4D depicts the result of the subsequent removal of the interlayer dielectric layer 420 and formation of a source/drain contact 421 in the source/drain region 235B (with the region 220 draw with the second source/drain end exposed for the sake of illustration.

Figure 5:
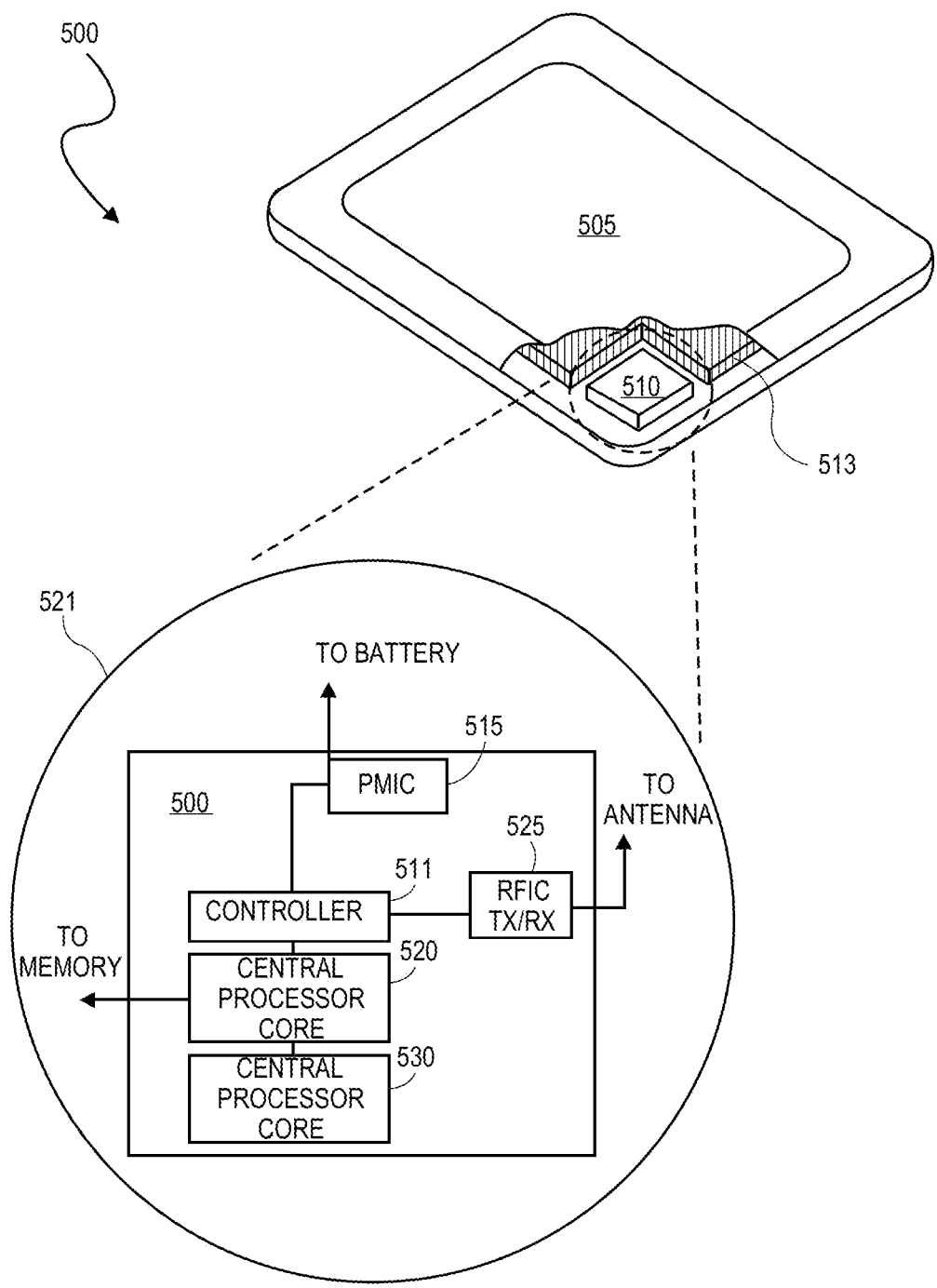
FIG. 5 is a functional block diagram of an SoC implementation of a mobile computing platform, in accordance with an embodiment of the present invention.

FIG. 5 is a functional block diagram of a SoC implementation of a mobile computing platform, in accordance with an embodiment of the present invention. The mobile computing platform 500 may be any portable device configured for each of electronic data display, electronic data processing, and wireless electronic data transmission. For example, mobile computing platform 500 may be any of a tablet, a smart phone, laptop computer, etc. and includes a display screen 505 that is in the exemplary embodiment a touchscreen (e.g., capacitive, inductive, resistive, etc.) permitting the receipt of user input, the SoC 510, and a battery 513. As illustrated, the greater the level of integration of the SoC 510, the more of the form factor within the mobile computing platform 500 that may be occupied by the battery 513 for longest operative lifetimes between charging, or occupied by memory (not depicted), such as a solid state drive, for greatest functionality.

Depending on its applications, mobile computing platform 500 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 510 is further illustrated in the expanded view 521. Depending on the embodiment, the SoC 510 includes a portion of a substrate 102 (i.e., a chip) upon which two or more of a power management integrated circuit (PMIC) 515, RF integrated circuit (RFIC) 525 including an RF transmitter and/or receiver, a controller thereof 511, and one or more central processor core 530, 531 is fabricated. The RFIC 525 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 525 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 515 and RFIC 525. In embodiments of the present invention, the PMIC 515 and RFIC 525 employ one or more of the group III-nitride transistors as described herein (e.g., group III-nitride transistor 401) utilizing an embodiment of the horizontal c-axis III-N epitaxial stacks described herein. In further embodiments the PMIC 515 and RFIC 525 employing the group III-nitride transistors described herein are integrated with one or more of the controller 511 and processor cores 530, 531 provided in silicon CMOS technology monolithically integrated with the PMIC 515 and/or RFIC 525 onto the (silicon) substrate 102. It will be appreciated that within the PMIC 515 and/or RFIC 525, the high voltage, high frequency capable group III-nitride transistors described herein need not be utilized in exclusion to CMOS, but rather silicon CMOS may be further included in each of the PMIC 515 and RFIC 525.

The group III-nitride transistors described herein may be specifically utilized where a high voltage swings present (e.g., 7-10V battery power regulation, DC-to-DC conversion, etc. within the PMIC 515). As illustrated, in the exemplary embodiment the PMIC 515 has an input coupled to the battery 513 and has an output provide a current supply to all the other functional modules in the SoC 510. In a further embodiment, where additional ICs are provided within the mobile computing platform 500 but off the SoC 510, the PMIC 515 output further provides a current supply to all these additional ICs off the SoC 510.

As further illustrated, in the exemplary embodiment the PMIC 515 has an output coupled to an antenna and may further have an input coupled to a communication module on the SoC 510, such as an RF analog and digital baseband module (not depicted). Alternatively, such communication modules may be provided on an IC off-chip from the SoC 510 and coupled into the SoC 510 for transmission. Depending on the group III-nitride materials utilized, the group III-nitride transistors described herein (e.g., III-N transistor 401) may further provide the large power added efficiency (PAE) needed from a power amplifier transistor having an $F_t$ of at least ten times carrier frequency (e.g., a 1.9 GHz in an RFIC 725 designed for 3G or GSM cellular communication).

Figure 6:
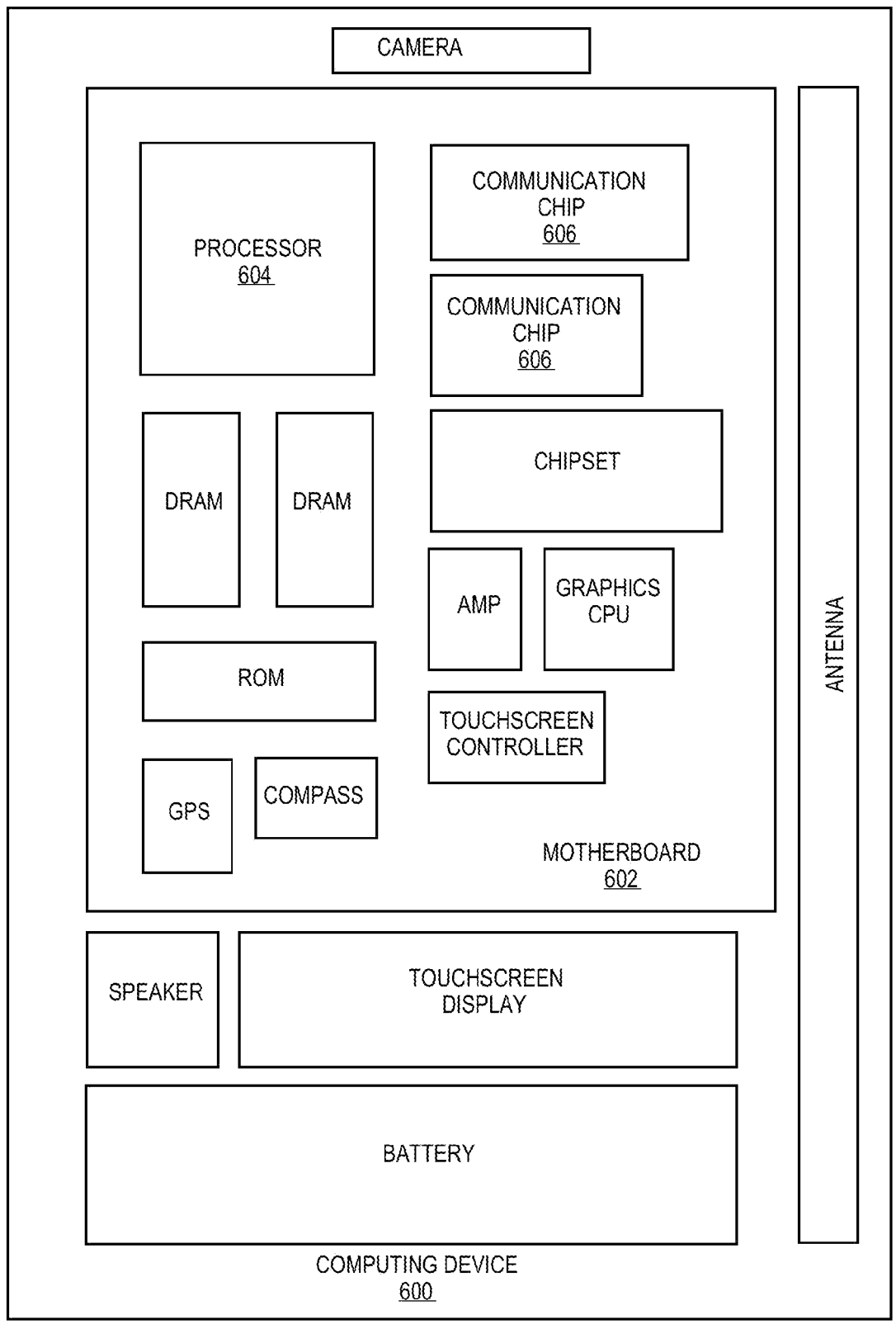
FIG. 6 is a functional block diagram of a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter-range wireless communications such as Wi-Fi and Bluetooth and a second communication chip 606 may be dedicated to longer-range wireless communications such as GPS, EDGE, GPRS, CDMA, WiMAX, LTE, Ev-DO, and others.

The processor 604 of the computing device 600 includes an integrated circuit die packaged within the processor 604. In some embodiments of the invention, the integrated circuit die of the processor includes one or more devices, such as III-N graded channel MOS-FETs built in accordance with embodiments described elsewhere herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another embodiment of the invention, the integrated circuit die of the communication chip includes one or more devices, such as MOS-FETs with features and/or fabricated in accordance with embodiments described elsewhere herein.

In further implementations, another component housed within the computing device 600 may contain an integrated circuit die that includes one or more devices, such as MOS-FETs with features and/or fabricated in accordance with embodiments described elsewhere herein.

In embodiments, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A non-planar III-N transistor disposed on a substrate, the transistor comprising:
   a non-planar III-N semiconductor body comprising two wide band gap material layers on opposite {0001} sides of a III-N semiconductor channel that has a compositional grading along the c-axis between the two wide band gap III-N layers;
   a gate stack comprising a gate dielectric and gate electrode, the gate stack disposed over opposing surface of the III-N semiconductor channel, said opposing surfaces span a distance between the two wide band gap material layers; and
   a pair of source/drain regions embedded in or coupled to the non-planar III-N semiconductor body at opposite sides of the gate stack.

2. The III-N transistor of claim 1, wherein the III-N semiconductor channel has a band gap that decreases from at least one of the two wide band gap material layers toward a center plane orthogonal to the c-axis and centered within the III-N semiconductor channel.

3. The III-N transistor of claim 2, wherein the III-N semiconductor channel has a decreasing band gap from both of the two wide band gap material layers toward the center plane.

4. The III-N transistor of claim 3, wherein the compositional grading is uniform and symmetric about the center plane.

5. The III-N transistor of claim 2, wherein the compositional grading comprises at least one of a lower In content and higher Al content proximate to at least one of the two wide band gap material layers relative to a point distal from at least one of the two wide band gap material layers.

6. The III-N transistor of claim 5, wherein the In content varies by at least 10% between the at least one wide band gap material layer and the center plane.

7. The III-N transistor of claim 5, wherein the III-N semiconductor channel comprises InGaN and is compositionally graded from GaN proximate to each of the wide band gap material layers to approximately 10% Indium at the center plane.

8. The III-N transistor of claim 5, wherein the III-N semiconductor channel comprises InGaN and is compositionally graded from GaN proximate to a first of the wide band gap material layers to maximum In content at a second of the wide band gap material layers.

9. The III-N FET of claim 8, wherein the gate stack wraps completely around both of the two wide band gap layers to form a III-N nanowire transistor.

10. The III-N FET of claim 9, wherein the nanowire is disposed within a vertical stack of nanowires, wherein each of the nanowires has a channel region comprising a III-N semiconductor channel that is compositionally graded along the c-axis between the two wide band gap III-N layers.

11. The III-N transistor of claim 2, wherein the III-N semiconductor channel is compositionally graded with a highest Al content proximate to each of the two wide band gap material layers, decreasing toward the center plane.

12. The III-N transistor of claim 1, wherein the wide band gap material layer proximate the (000$\bar{1}$) surface of the non-planar III-N semiconductor body is selected from the group consisting of: AlN, AlInN, AlGaN, or AlInGaN, and wherein the wide band gap material layer proximate the (0001) surface of the non-planar III-N semiconductor body is composed of AlN, AlInN, AlGaN, or AlInGaN.

13. A system on chip (SoC), comprising:
   a power management integrated circuit (PMIC) including at least one of a switching voltage regulator or switching mode DC-DC converter; and
   an RF integrated circuit (RFIC) including a power amplifier operable to operate with a cut-off frequency, $F_t$ and maximum oscillation frequency, $F_{max}$ of both at least 20 GHz, and to generate a carrier wave frequency of at least 2 GHz, wherein both of the PMIC and RFIC are monolithically integrated onto a same substrate, and wherein at least one of PMIC and RFIC include the III-N transistor of claim 1.

14. The SoC of claim 13, further comprising:
a controller of at least one of the PMIC and RFIC integrated onto the substrate, wherein the controller comprises CMOS technology fabricated with silicon field effect transistors.

15. A mobile computing device, comprising:
a touchscreen;
a battery;
an antenna;
a DC-to-DC converter coupled to the battery; and
a wireless transmitter further including a power amplifier (PA), wherein at least one of the DC-to-DC converter and the PA comprises the III-N transistor as in claim 1.

16. The mobile computing device of claim 15 where the DC-to-DC converter comprises a first III-N transistor as in claim 1, and the PA employs a second III-N transistor as in claim 1.

17. A non-planar III-N transistor disposed on a substrate, the transistor comprising:
a non-planar III-N semiconductor body comprising two wide band gap crystalline material layers on opposite sides of a III-N semiconductor channel that has a compositional grading along the c-axis between the two wide band gap crystalline material layers;
a gate stack comprising a gate dielectric and gate electrode, the gate stack disposed over opposing surface of the III-N semiconductor channel, said opposing surfaces span a distance between the two wide band gap crystalline material layers; and
a pair of source/drain regions embedded in or coupled to the non-planar III-N semiconductor body at opposite sides of the gate stack;
wherein a transport channel is formed in the III-N semiconductor channel adjacent to both opposing surfaces in response to a bias voltage on a gate electrode exceeding a threshold voltage of the non-planar III-N transistor.

18. The III-N transistor of claim 17, wherein the transport channel adjacent to a first of the wide band gap crystalline material layers proximate to a (0001) surface of the III-N semiconductor channel forms a continuous transport channel spanning the (0001) surface and a plurality of {1010} surfaces of the III-N semiconductor channel.

19. The III-N transistor of claim 17, wherein the III-N semiconductor channel has a decreasing band gap from both of the two wide band gap crystalline material layers toward a plane through the center of III-N semiconductor channel.

* * * * *